(12) United States Patent
Lee et al.

(10) Patent No.: US 8,488,396 B2
(45) Date of Patent: Jul. 16, 2013

(54) DUAL RAIL STATIC RANDOM ACCESS MEMORY

(75) Inventors: Cheng Hung Lee, Hsinchu (TW);
Hong-Chen Cheng, Hsinchu (TW);
Chung-Ji Liu, Fongyuan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 247 days.

(21) Appl. No.: 12/700,034

(22) Filed: Feb. 4, 2010

(65) Prior Publication Data
US 2011/0188326 A1 Aug. 4, 2011

(51) Int. Cl.
*G11C 7/00* (2006.01)
(52) U.S. Cl.
USPC ............ 365/189.11; 365/203; 365/189.09; 365/154; 365/230.06
(58) Field of Classification Search
USPC .......... 365/189.09, 189.11, 230.06, 203, 365/230.05, 154, 156
See application file for complete search history.

(56) References Cited

U.S. PATENT DOCUMENTS

| | | | | |
|---|---|---|---|---|
| 6,339,318 | B1 * | 1/2002 | Tanaka | 323/313 |
| 6,667,921 | B2 * | 12/2003 | Park | 365/203 |
| 6,859,386 | B2 * | 2/2005 | Izutsu | 365/154 |
| 6,876,573 | B2 * | 4/2005 | Higeta et al. | 365/156 |
| 7,372,721 | B2 * | 5/2008 | Sachdev et al. | 365/154 |
| 7,408,827 | B1 * | 8/2008 | Peng et al. | 365/207 |
| 7,564,728 | B2 * | 7/2009 | Han | 365/203 |
| 7,800,959 | B2 * | 9/2010 | Childs et al. | 365/189.08 |
| 7,936,624 | B2 * | 5/2011 | Clinton | 365/203 |
| 7,995,410 | B2 * | 8/2011 | Campbell et al. | 365/203 |
| 2010/0188912 | A1 * | 7/2010 | Shinohara | 365/203 |

FOREIGN PATENT DOCUMENTS

| | | |
|---|---|---|
| CN | 1508806 | 6/2004 |
| CN | 101789261 | 7/2010 |

OTHER PUBLICATIONS

CN Office Action dated Sep. 5, 2012 from corresponding application No. 201010228343.5.

* cited by examiner

*Primary Examiner* — Kretelia Graham
(74) *Attorney, Agent, or Firm* — Lowe Hauptman Ham & Berner, LLP

(57) ABSTRACT

A static random access memory (SRAM) macro includes a first power supply voltage and a second power supply voltage that is different from the first power supply voltage. A precharge control is connected to the second power supply voltage. The precharge control is coupled to a bit line through a bit line precharge. At least one level shifter receives a level shifter input. The level shifter converts the level shifter input having a voltage level closer to the first power supply voltage than the second power supply voltage to a level shifter output having a voltage level closer to the second power supply voltage than the first power supply voltage. The level shifter output is provided to the precharge control.

11 Claims, 4 Drawing Sheets

DUAL RAIL STATIC RANDOM ACCESS MEMORY

TECHNICAL FIELD

The present disclosure relates generally to a static random access memory (SRAM), more particularly to a dual rail SRAM.

BACKGROUND

In general, a static random access memory (SRAM) tends to have aggressive design rules to reduce the size of devices and increase the capacity in the system on chip (SoC) solutions. Therefore, the SRAM is more susceptible to process variability. Also, while the operation voltage is being scaled with the reduction in the size of devices, the threshold voltage of the transistor is not scaling at the same rate, which means that chip designers have less voltage headroom for the transistors.

The voltage scaling with the reduction in the size of devices, i.e., the above reduction in voltage headroom, is limited by static noise margin (SNM). SNM is an important SRAM parameter that is a direct measure of how well an SRAM memory cell can maintain a logic state "0" or "1" when the SRAM memory cell is perturbed by noise or with intrinsic imbalance between the cross-coupled inverters and leakage defects within the transistors forming the SRAM bit. An SRAM bit can easily be upset when accessed if the SRAM is designed with insufficient SNM throughout its operating voltage range. The SRAM bit is accessed when the word line for the bit is activated (e.g. high) for either reading from that bit, or for writing to another bit on the same row of the memory array but on a different column of that memory array. When a lower supply voltage (e.g., Vdd) is used and the bit line precharges to Vdd, the SRAM circuit has a minimum power supply voltage limitation because of SNM.

A dual rail SRAM is used to avoid the SNM limitation at lower voltage. The dual rail SRAM feature is also associated with dynamic power reduction techniques. In one such technique, a part of the memory, called a memory periphery logic circuit, operates at a lower power supply voltage Vdd than the SRAM-bit in order to reduce dynamic power consumption. This technique allows for reduction of the active power while maintaining sufficient performance. For example, the bit cell can use another power supply voltage, e.g. CVdd, where CVdd is usually higher than Vdd, in order to maintain a sufficient SNM.

However, when the above technique is used a PMOS transistor in a dual rail SRAM circuit that is supposed to be turned off may have a gate voltage lower than a power supply voltage supplied to the source of the PMOS transistor because of circuit connections to different power supply voltages, e.g. Vdd and CVdd. Therefore, this PMOS transistor does not fully turn off. Because the PMOS transistor is not properly turned off, current leaks through a direct current path between the power supply and ground during read/write operations or while the SRAM is in standby mode. Accordingly, new methods for dual rail SRAM are desired.

BRIEF DESCRIPTION OF THE DRAWINGS

For a more complete understanding of the presently disclosed embodiments, and the advantages thereof, reference is now made to the following descriptions taken in conjunction with the accompanying drawings, in which.

DETAILED DESCRIPTION OF ILLUSTRATIVE EMBODIMENTS

The making and using of various embodiments are discussed in detail below. It should be appreciated, however, that the present disclosure includes many concepts that can be embodied in a wide variety of specific contexts. The specific embodiments discussed are merely illustrative of specific ways to make and use, and do not limit the scope of this disclosure.

Figure 1:
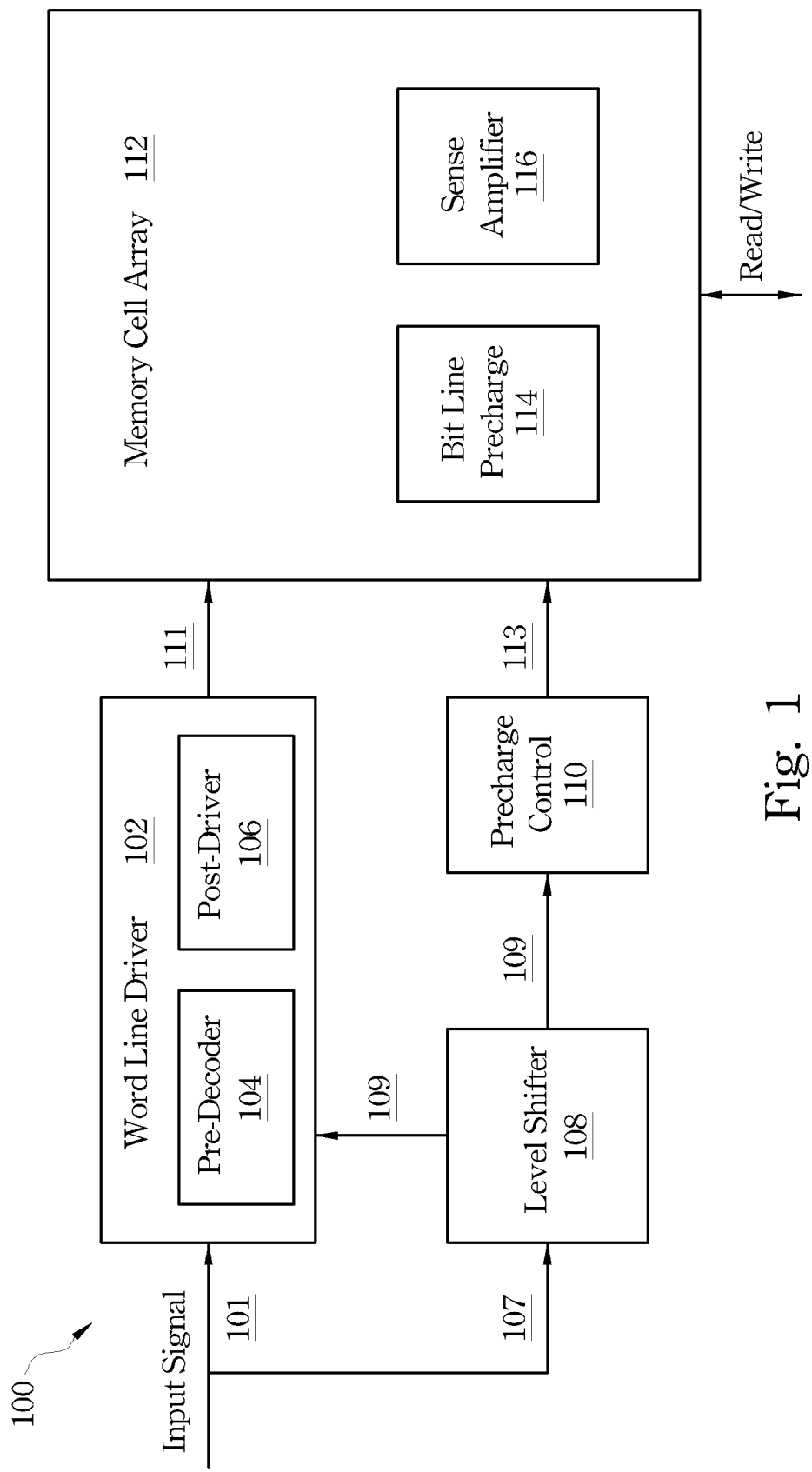
FIG. 1 is a schematic of an exemplary dual rail SRAM macro according to an embodiment.

FIG. 1 illustrates a schematic drawing of an exemplary dual rail SRAM macro. The dual rail SRAM macro 100 includes a word line driver 102, a level shifter 108, a precharge control 110, a memory cell array 112, a bit line precharge 114, and a sense amplifier 116. The word line driver 102 includes a pre-decoder 104 and a post-driver 106. The sense amplifier 116 is connected to the bit line to detect the bit line state.

The word line driver 102 receives an input signal 101, e.g. an encoded signal including address information of the memory cell array 112 to be accessed for a read/write operation. The input signal 101 can also contain a clock signal. The word line driver 102 has a word line 111 output connected to the memory cell array 112 to enable a read/write operation. The input signal 101 has a voltage level that comes from a periphery logic circuit power supply voltage Vdd. The input signal 101 can be decoded in the pre-decoder 104 to enable the post driver 106 to drive the word line 111 so that the proper memory cell in the memory cell array 112 can be accessed.

The level shifter 108 also receives at least a portion of the input signal 101 (i.e., the input signal 101 can include more than one signal and some signals are provided to the level shifter 108.) Which portion of the input signal 101 the level shifter 108 receives via input 107 depends on the specific logic implementation of the input signal 101 and the word line driver 102 that includes the pre-decoder 104. Examples are described under FIG. 2 and FIG. 3. The level shifter input 107 is converted from Vdd to another voltage level, e.g. cell power supply voltage CVdd (e.g. shown in FIG. 2). The level shifter output 109 is provided to the precharge control 110 and/or the word line driver 102. The precharge control 110 has a precharge control output 113 to enable the bit line precharge 114 so that the connected bit line in the memory cell array 112 can be precharged for read/write operations. There can be more than one level shifter 108 that have similar functionality depending on the applications. In some embodiments, the precharge control 110 is connected to CVdd (e.g. shown in FIG. 2).

Figure 2:
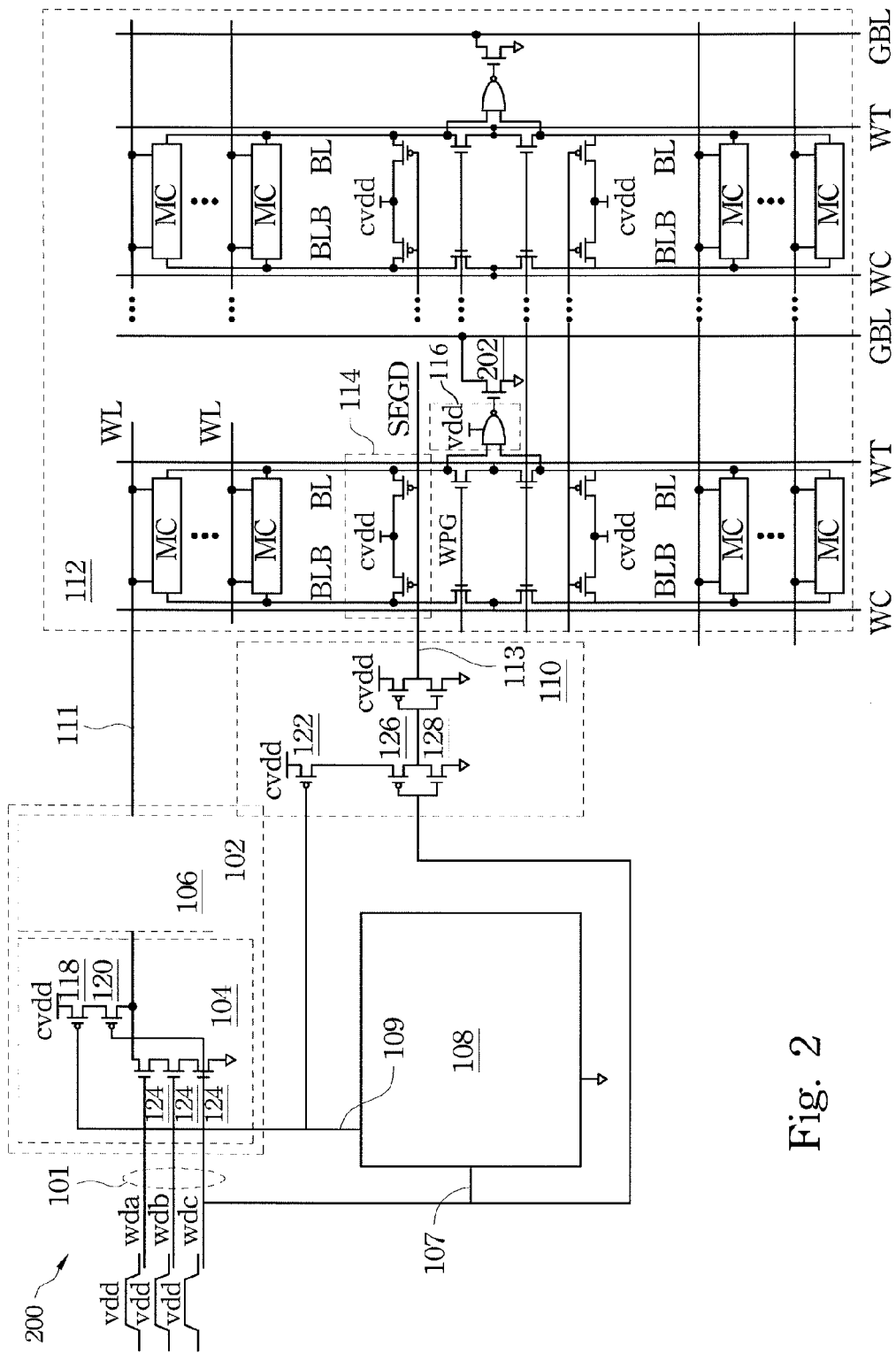
FIG. 2 is a schematic of an exemplary embodiment of a circuit for implementing the dual rail SRAM macro of FIG. 1 in an integrated circuit according to an embodiment.

FIG. 2 illustrates an exemplary embodiment of a circuit for implementing the dual rail SRAM macro of FIG. 1 in an integrated circuit. The word line driver 102 and the precharge control 110 operate using the cell power supply voltage CVdd. BL denotes a bit line, BLB denotes a bit line bar, WL denotes a word line, SEGD denotes a precharge signal, WT denotes a write data signal, WC denotes a WT bar signal, and GBL denotes a global bit line.

The input signals 101 of word line driver 102 include e.g. wda, wdb, and wdc. The input signals 101 have a voltage level of Vdd. CVdd is higher than Vdd in this example, and can be about 0.4 V higher in one embodiment. Input 107 of level shifter 108 includes, e.g., wdc. The level shifter 108 is known in the art, and can be implemented in a variety of ways. The level shifter 108 converts the voltage level at input 107, e.g. wdc, from Vdd to CVdd. In some embodiments, Vdd is in the range of 0.5 V-1.3 V, CVdd is in the range of 0.8 V-1.5 V, and the difference between CVdd and Vdd can be in the range of 0.2 V-0.6 V. However, the voltage ranges for other embodiments are not limited to the above values.

The level shifter output 109 is provided to the word line driver 102, more particularly to the pre-decoder 104, and the precharge control 110. In this example, the gate of a PMOS transistor 118 in the pre-decoder 104 receives the level shifter output 109 with a voltage level CVdd. The source of the PMOS 118 is connected to CVdd. When the input signal wdc has a voltage for logic "1", e.g. Vdd, the level shifter output has a voltage CVdd that is connected to the gate of the PMOS transistor 118. This level shifter output turns off the PMOS transistor 118 better than an output that is not level shifted, thus, preventing a leakage from CVdd through the PMOS transistor 120.

If the PMOS transistor 118 were not used in the circuit of FIG. 2 and the source of the PMOS transistor 120 were directly connected to CVdd, the PMOS transistor 120 could not be turned off properly. This is because the input signal wdc with a voltage level Vdd is connected to the gate of the PMOS transistor 120 and without PMOS transistor 118 a higher voltage CVdd would be connected to the source of the PMOS transistor 120. Therefore, if the input signals wda and wdb were also at the voltage Vdd for logic "1" in addition to wdc, to turn on the three NMOS transistors 124, there would be a direct current leakage path from CVdd to ground through the PMOS transistor 120 and the NMOS transistors 124. By having the PMOS transistor 118, the word line driver 104 can properly turn off the unintended leakage path. In the circuit of FIG. 2, when the input signal wdc has a voltage for logic "0", then both the PMOS transistors 118 and 120 are properly turned on as expected, and the logic operation function as usual.

The operation of the precharge control 110 side is similar. The precharge control 110 also receives the level shifter output 109 at the gate of the PMOS transistor 122. The source of the PMOS transistor 122 is connected to CVdd. When the input signal 107, e.g. wdc has a voltage for logic "1", e.g. Vdd, the level shifter output 109 that is connected to the gate of the PMOS transistor 122 has a voltage CVdd. This turns off the PMOS transistor 122.

However, if the PMOS transistor 122 were not used in the circuit of FIG. 2 and the source of the PMOS transistor 126 were directly connected to CVdd, the current flow through PMOS transistor 126 could not be turned off properly. This is because the input signal wdc with a voltage level Vdd is connected to the gate of the PMOS transistor 126, and a higher voltage CVdd is connected to the source of the PMOS transistor 126. Because the wdc with a voltage Vdd turns on an NMOS transistor 128, there is a direct current leakage path from CVdd to ground through the PMOS transistor 126 and the NMOS transistor 128. Therefore, by having the PMOS transistor 122, the precharge control 110 can properly turn off the unintended leakage path. When the input signal wdc is at a voltage for logic "0", then both the PMOS transistor 122 and 126 are properly turned on as expected, and the logic operation has no problem.

Even though the level shifter output is connected to both the precharge control 110 and the word line driver 102, other arrangements are possible. For example, the level shifter output can be connected to only the precharge control 110 and the word line driver 102 may have a different design. A person skilled in the art will appreciate that there can be many variations of the dual rail SRAM design that can benefit from the embodiments described in this disclosure.

In FIG. 2, the sense amplifier 116 has an input connected to the bit line to detect the bit line state. The sense amplifier output is connected to the pull down NMOS transistor 202 that can lower the voltage on the global bit line GBL. In this example, the sense amplifier 116 is implemented using a NAND gate, and connected to Vdd. In embodiments, the sense amplifier 116 can be connected to Vdd when (CVDD−VDD)>−0.2 V in order to prevent current leakage. In the alternative, the sense amplifier 116 can be connected to CVdd. The precharge control 110 is coupled to the bit line precharge 114 that includes two PMOS transistors that precharge the bit line. The two PMOS transistors of the bit line precharge 114 are controlled by the precharge signal SEGD on the precharge control output 113. In some embodiments, the bit line BL and the bit line bar BLB are coupled to CVdd, and thus precharge the bit line BL and the bit line bar BLB to CVdd in response to the precharge signal SEGD turning on the PMOS transistors. In addition, at least one NMOS transistor is connected between the write data signal WT and the bit line BL, and at least one other NMOS transistor is connected between the WT bar signal and bit line bar BLB. The two NMOS transistors are controlled by a write potential signal WPG to respectively couple the write data signal WT and the WT bar signal with the bit line BL and bit line bar BLB during a write operation.

Figure 3:
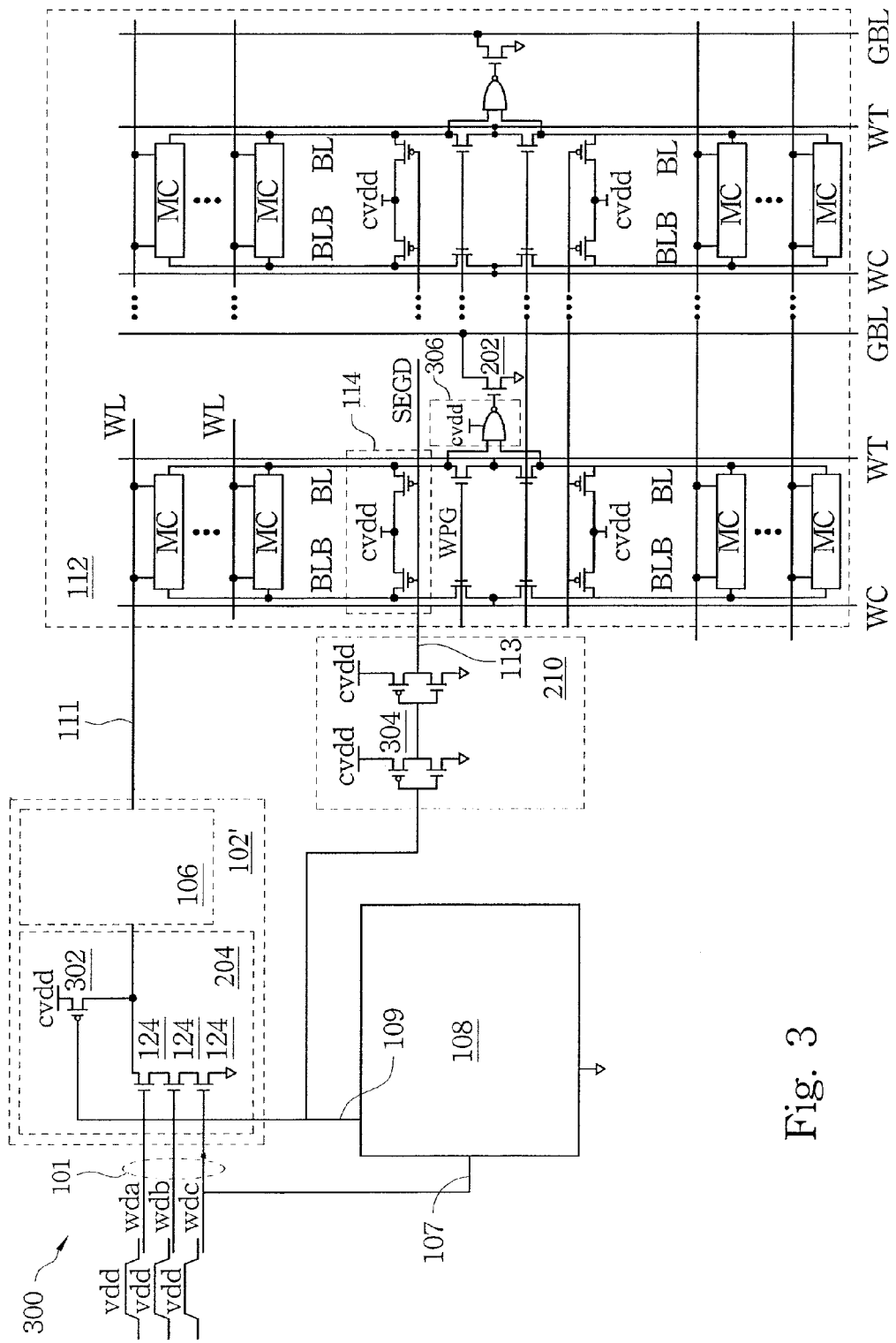
FIG. 3 is a schematic of another exemplary embodiment of a circuit for implementing the dual rail SRAM macro of FIG. 1 in an integrated circuit according to an embodiment.

FIG. 3 illustrates another exemplary embodiment of a circuit for implementing the dual rail SRAM macro of FIG. 1 in an integrated circuit. The dual rail SRAM macro 300 includes similar blocks as FIG. 2. The word line driver 102, pre-decoder 104 and precharge control 110 of FIG. 2 are, however, replaced by word line driver 102', pre-decoder 204 and precharge control 210. In the pre-decoder 204, a single PMOS transistor 302 replaces the cascade of PMOS transistors 118 and 120 (shown in FIG. 2). The sense amplifier 306 is coupled to CVdd. The input signal, e.g. wdc, is provided to the level shifter 108, and the level shifter output is connected to the gate of the PMOS transistor 302. In this embodiment, the logical function of the pre-decoder 204 is not affected, even though there could be transition leakage depending on the speed of the level shifter 108. For example, the input signal wdc has to go through the level shifter 108 before the input signal wdc reaches the gate of the PMOS transistor 302, while the input signals wda, wdb, and wdc directly reach NMOS transistors 124 without such a delay. Therefore, there may be a short time interval corresponding to the delay when both PMOS transistor 302 and NMOS transistors 124 are switched on allowing leakage current to pass. This leakage can be avoided by providing a matching delay for NMOS transistors 124.

The level shifter output is also provided to the gate of the PMOS transistor 304. The PMOS transistor 304 replaces the cascade of PMOS transistors 122 and 126 (shown in FIG. 2). In this embodiment, the logical function of the precharge control 210 is not affected. Even though specific logic implementations of the word line drivers 102 and 102' and the precharge controls 110 and 210 are shown in the exemplary embodiments of FIG. 2 and FIG. 3, there can be many different embodiments for the word line driver 102 and 102', and the precharge controls 110 and 210 that can benefit from embodiments of the disclosure.

Embodiments of the dual rail SRAM design can work well with lower Vdd without degrading SNM. Embodiments of this disclosure are well suited for a high-speed single-ended sense amplifying SRAM design architecture. For example, this disclosure can be used for a high speed single port dual rail architecture in embedded central processing unit (eCPU) applications. The minimum power supply voltage Vdd is not then limited by the SRAM bit cell that operates from CVdd, even though there could be design considerations depending on the specific implementation of the level shifter 108 and periphery logic circuits. Multiple memory cells can share the level shifter 108, e.g. one level shifter 108 can be used for a SRAM bank. This kind of sharing produces a simple design that saves on chip area.

Figure 4:
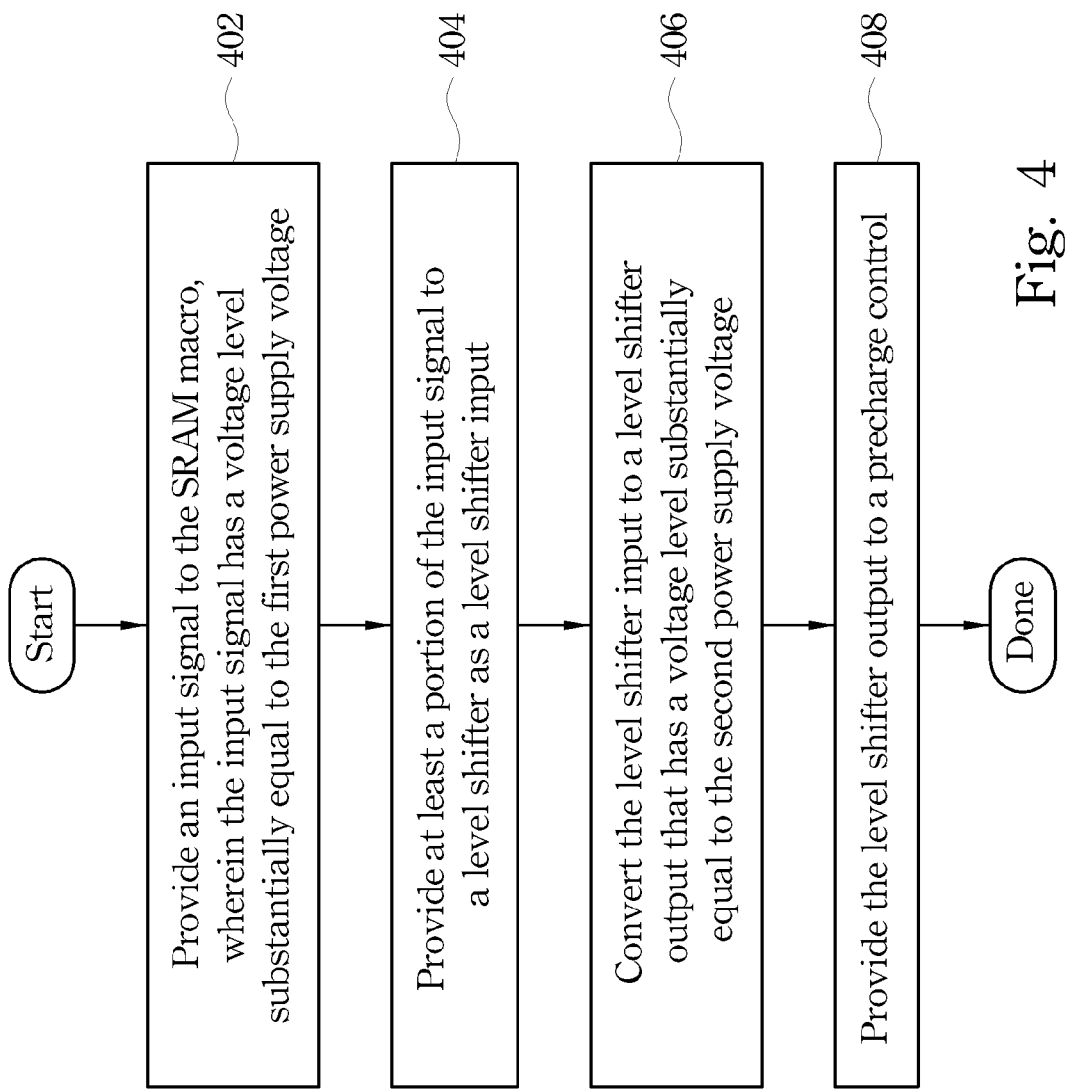
FIG. 4 is a schematic of an exemplary flow chart of a method of operation for a dual rail SRAM macro illustrated in FIG. 1 according to an embodiment.

FIG. 4 illustrates an exemplary flow chart of a method for a dual rail SRAM macro in accordance with FIG. 1. In step 402, the input signal is input to the SRAM macro 100, wherein the input signal 101 has a voltage level substantially equal to the first power supply voltage, e.g. Vdd. In step 404, at least a portion of the input signal 101 is input to the level shifter 108 as a level shifter input 107. Which portion of the input signal 101 the level shifter 108 receives depends on the specific logic implementation of the input signal 101 and the word line driver 102, including the pre-decoder 104. In step 406, the level shifter input 107 is converted to the level shifter output 109 that has a voltage level substantially equal to the second power supply voltage, e.g. CVdd. In step 408, the level shifter output 109 is input to the precharge control 110. A person skilled in the art will appreciate that there can be many embodiment variations of this disclosure.

Although the present disclosure and the advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the disclosure is intended to include such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

Each claim of this document constitutes a separate embodiment, and embodiments that combine different claims and/or different embodiments are within scope of the disclosure and will be apparent to those skilled in the art after reviewing this disclosure. Accordingly, the scope of the disclosure should be determined with reference to the following claims, along with the full scope of equivalences to which such claims are entitled.

What is claimed is:

1. A static random access memory (SRAM) macro, comprising:
   a first power supply voltage;
   a second power supply voltage different from the first power supply voltage;
   a precharge control connected to the second power supply voltage, the precharge control coupled to a bit line through a bit line precharge;
   at least one level shifter, wherein the at least one level shifter is adapted to: (a) receive an input voltage closer to the first power supply voltage than the second power supply voltage, (b) convert the input voltage to a level shifter output having a voltage closer to the second power supply voltage than the first power supply voltage, and (c) provide the level shifter output to the precharge control; and
   a word line driver connected to the second power supply voltage,
   wherein the level shifter output is provided to the word line driver, the word line driver includes at least one first PMOS transistor, and the level shifter output is provided to a gate of the at least one first PMOS transistor, and
   wherein the precharge control includes a second PMOS transistor, and the level shifter output is arranged to be concurrently provided to a gate of the second PMOS transistor and the gate of the first PMOS transistor.

2. The SRAM macro of claim 1, wherein the gate of the first PMOS transistor is connected to the gate of the second PMOS transistor in the precharge control.

3. The SRAM macro of claim 1, wherein the precharge control is coupled to a bit line precharge that includes at least two bit line precharge PMOS transistors, and the at least two bit line precharge PMOS transistors precharge the bit line to the second power supply voltage.

4. The SRAM macro of claim 1, further comprising a sense amplifier having a sense amplifier input and a sense amplifier output, wherein the sense amplifier input is connected to the bit line, the sense amplifier output is connected to a pull down NMOS transistor.

5. The SRAM macro of claim 4, wherein a drain of the pull down NMOS transistor is connected to a global bit line.

6. The SRAM macro of claim 4, wherein the sense amplifier is connected to the second power supply voltage.

7. The SRAM macro of claim 4, wherein the second power supply voltage is greater than a voltage level that is 0.2V less than the first power supply voltage, and the sense amplifier is connected to the first power supply voltage.

8. A method for operating a static random access memory (SRAM) macro, comprising:
   inputting an input signal to the SRAM macro, wherein the input signal has a voltage level substantially equal to a first power supply voltage;
   inputting at least a portion of the input signal to a level shifter as a level shifter input;
   converting the level shifter input to a level shifter output that has a voltage level substantially equal to a second power supply voltage;
   concurrently inputting the level shifter output to a word line driver and a precharge control,
   wherein the word line driver includes at least one first PMOS transistor, the precharge control includes a second PMOS transistor, and the level shifter output is input to a gate of the at least one first PMOS transistor and a gate of the second PMOS transistor.

9. The method of claim 8, wherein the gate of the at least one first PMOS transistor is connected to the gate of the second PMOS transistor in the precharge control.

10. The method of claim 8, further comprising connecting a sense amplifier in the SRAM macro to the first power supply voltage when the second power supply voltage is greater than a voltage level that is 0.2V less than the first power supply voltage.

11. The method of claim 10, further comprising connecting the sense amplifier in the SRAM macro to the second power supply voltage.

* * * * *